US006909604B2

(12) United States Patent
Tanaka et al.

(10) Patent No.: US 6,909,604 B2
(45) Date of Patent: Jun. 21, 2005

(54) COOLING DEVICE CAPABLE OF REDUCING THICKNESS OF ELECTRONIC APPARATUS

(75) Inventors: Atsuko Tanaka, Kawasaki (JP); Masuo Ohnishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/664,933

(22) Filed: Sep. 22, 2003

(65) Prior Publication Data

US 2004/0095725 A1 May 20, 2004

Related U.S. Application Data

(62) Division of application No. 10/096,509, filed on Sep. 17, 2001, now Pat. No. 6,665,181.

(30) Foreign Application Priority Data

Sep. 17, 2001 (JP) ........................................ 2001-281683

(51) Int. Cl.[7] ................................................. H05K 7/20
(52) U.S. Cl. ...................... 361/695; 165/80.3; 165/122; 361/719; 361/704; 415/176
(58) Field of Search ........................ 62/259.2; 165/80.2, 165/80.3, 121, 122, 104.33; 174/15.2, 16.3; 361/690, 687, 692–695, 697, 700, 719–721; 454/186; 415/175–178; 257/722

(56) References Cited

U.S. PATENT DOCUMENTS

| 5,288,961 A | 2/1994 | Shibuya et al. ............. 361/695 |
| 5,731,953 A | 3/1998 | Sakurai ...................... 361/695 |
| 5,810,554 A | 9/1998 | Yokozawa et al. .......... 415/176 |
| 6,141,218 A | 10/2000 | Miyahara .................... 361/695 |
| 6,665,181 B2 * | 12/2003 | Tanaka et al. .............. 361/695 |

FOREIGN PATENT DOCUMENTS

| JP | 6 177567 | 6/1994 |
| JP | 2000 77877 | 3/2000 |
| JP | 2001-284863 | 10/2001 |

* cited by examiner

Primary Examiner—Gregory Thompson
(74) Attorney, Agent, or Firm—Armstrong, Kratz, Quintos, Hanson & Brooks, LLP

(57) ABSTRACT

A fan housing of a fan unit includes a housing wall standing from the surface of a printed circuit board. The printed circuit board serves to establish the fan housing in cooperation with the housing wall. The fan housing further includes a ceiling wall connected to the housing wall. The ceiling wall extends along a datum plane parallel to the surface of the printed circuit board. A high speed airflow can be generated within the fan housing. The airflow promotes the heat radiation from the printed circuit board. An electrically conductive wiring pattern extending over the surface of the printed circuit board may further promote the heat radiation from the printed circuit board.

6 Claims, 7 Drawing Sheets

COOLING DEVICE CAPABLE OF REDUCING THICKNESS OF ELECTRONIC APPARATUS

This is a division of application Ser. No. 10/096,509, filed Sep. 17, 2001, now U.S. Pat. No. 6,665,181.

BACKGROUND OF THE INVENTION

1. Field of the Invention

The present invention relates to a printed circuit board unit with a cooling device in general incorporated within an electronic apparatus such as a portable digital assistant (PDA), a notebook personal computer, and the like. In particular, the invention relates to a printed circuit board unit comprising a printed circuit board, a ventilation fan rotatable around the rotation axis intersecting the printed circuit board, and a fan housing accommodating the ventilation fan.

2. Description of the Prior Art

As disclosed in Japanese Patent Application Publication P2000-77877A, a so-called fan unit includes a fan housing accommodating a ventilation fan rotating around the rotation axis. When the ventilation fan rotates, air is allowed to flow in the centrifugal direction of the rotation axis. The fan housing serves to guide the air toward the outlet. The air is discharged out of the outlet. At the same time, air surrounding the fan housing is introduced into the fan housing through the inlet. The inlet is defined to face the surface of the printed circuit board. When the air is sucked into the fan housing, air is allowed to flow along the surface of the printed circuit board.

In general, a number of electronic components are mounted on the surface of the printed circuit board. The respective electronic components protrude from the surface of the printed circuit board, so that the electronic components hinder a smooth flow of the air. The turbulence in the air is supposed to constrain the ventilation fan from sucking the air into the fan housing. The suction quantity of the air may be reduced. The ventilation fan suffers from reduction in the cooling efficiency. As the printed circuit board gets thinner, the space is reduced between the fan housing and the surface of the printed circuit board. The cooling efficiency of the ventilation fan may still get deteriorated.

SUMMARY OF THE INVENTION

It is accordingly an object of the present invention to provide a printed circuit board unit with a cooling device contributing to reduction in the thickness of an electronic apparatus.

According to the present invention, there is provided a printed circuit board unit with a cooling device, comprising: a printed circuit board; a ventilation fan rotating around a rotation axis intersecting the printed circuit board; a housing wall standing from a surface of the printed circuit board at a periphery of the ventilation fan; and an outlet defined in the housing wall.

The printed circuit board and the housing wall cooperate to define a space for accommodating the ventilation fan. When the ventilation fan rotates, the movement of air, namely, airflow can be generated within the space. The printed circuit board and the housing wall lead the air toward the outlet. In this manner, the printed circuit board can be utilized to form the cooling device.

In particular, a high speed airflow can be generated within the space in the printed circuit board unit and the housing wall. The airflow efficiently absorbs the heat from the surface of the printed circuit board. The heat radiation from the printed circuit board can be promoted. In general, an electrically conductive metallic wiring pattern extends over the surface of the printed circuit board. The metallic wiring pattern usually has a superior heat conductivity as compared with the material of the printed circuit board. The metallic wiring pattern thus contributes to promotion of the heat radiation from the printed circuit board. In particular, the metallic wiring pattern inside the housing wall leads to an improved promotion of the heat radiation from the printed circuit board.

The printed circuit board unit of the aforementioned type may further comprise: a ceiling wall connected to an upper end of the housing wall and extending along a datum plane parallel to the surface of the printed circuit board; and an inlet defined in the ceiling wall.

In general, a number of electronic components are mounted on the surface of the printed circuit board. The electronic components protrude from the surface of the printed circuit board. The electronic components is supposed to hinder a smooth flow of the air along the surface of the printed circuit board. If the inlet is defined at a position spaced from the surface of the printed circuit board in the aforementioned manner, a smooth flow of the air can be established irrespective of the existence of the electronic components. The air can smoothly be sucked into the inlet. A large quantity of the air can be sucked, so that the cooling efficiency of the cooling device can be improved.

For example, if the printed circuit board of the aforementioned type is incorporated within an electronic apparatus, the inlet can be opposed to the inner surface of the enclosure of the electronic apparatus. Airflow can be generated along the inner surface of the enclosure in response to the suction of the air into the inlet. In general, a generally flat surface is defined on the inner surface of the enclosure. Less obstacles can be found on the inner surface of the enclosure as compared with the surface of the printed circuit board. A smooth airflow can thus be generated along the inner surface of the enclosure. The air is smoothly sucked into the inlet. Since the air is smoothly introduced into the inlet in this manner, a higher cooling efficiency can be kept even when the space is reduced between the inlet and the inner surface of the enclosure in the electronic apparatus. The thickness of the electronic apparatus can reliably be reduced.

The printed circuit board unit of the aforementioned type may further comprise an inlet defined in the printed circuit board inside the housing wall. Air can be introduced not only from the space adjacent the front side of the printed circuit board but also from the space adjacent the back side of the printed circuit board. A larger quantity of air can be sucked into the space defined by the printed circuit board and the housing wall, so that the cooling efficiency of the cooling device can further be improved. Moreover, the front and back sides of the printed circuit board can simultaneously be cooled down enough. It should be noted that the inlet in the printed circuit board may be established in place of the inlet in the ceiling wall. This structure contributes to a further reduction in the thickness of the electronic apparatus.

In addition, the printed circuit board unit of the aforementioned type may further comprise: an electronic component mounted on the printed circuit board; and an electrically conductive wiring pattern extending over the surface of the printed circuit board inside the housing wall and connected to the electronic component. The ventilation fan serves to promote the heat radiation from the electrically conductive wiring pattern. The heat radiation from the printed circuit board can still be improved. Moreover, since the electrically conductive wiring pattern is allowed to receive the heat from the electronic component, the electronic component can efficiently be cooled down.

A heat radiation fin may be attached to the printed circuit board and connected to the electronic component. The heat radiation fin promotes the heat radiation from the electrically conductive wiring pattern. The heat radiation fin may be located within the outlet. Alternatively, the heat radiation fin may be located to face the outlet.

An electronic component may be mounted on the printed circuit board inside the housing wall. A high speed airflow can be generated inside the housing wall based on the rotation of the ventilation fan in the aforementioned manner. Accordingly, the electronic component can efficiently be cooled down. The electronic component may be located within the outlet, for example.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
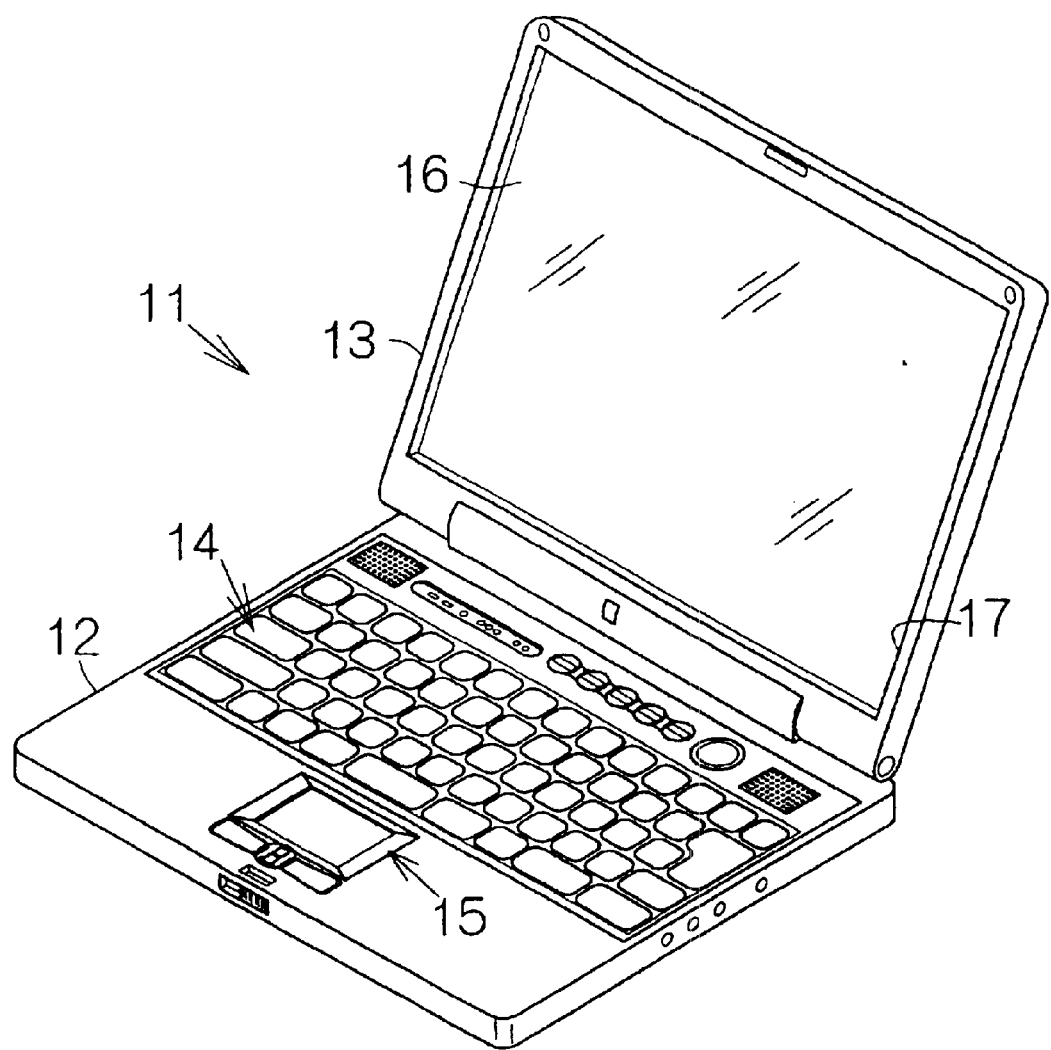
FIG. 1 is a perspective view schematically illustrating a notebook personal computer according to an example of an electronic apparatus.

FIG. 1 illustrates a notebook personal computer 11 as an example of an electronic apparatus. The notebook personal computer 11 includes a thin main body 12 and a display enclosure 13 coupled to the main body 12. The display enclosure 13 is allowed to swing relative to the main body 12. Input devices such as a keyboard 14 and a pointing device 15 are embedded in the surface of the main body 12. The user may utilize the keyboard 14 and the pointing device 15 so as to manipulate the notebook personal computer 11.

A liquid crystal display (LCD) panel module 16 is incorporated within the display enclosure 13, for example. The screen of the LCD panel module 16 is positioned in a window 17 defined in the display enclosure 13. The user is allowed to observe the operation of the notebook personal computer 11 based on texts and graphics, for example, displayed on the screen of the LCD display panel module 16. The display enclosure 13 may be superposed over the upper surface of the main body 12 through the swinging movement.

Figure 2:
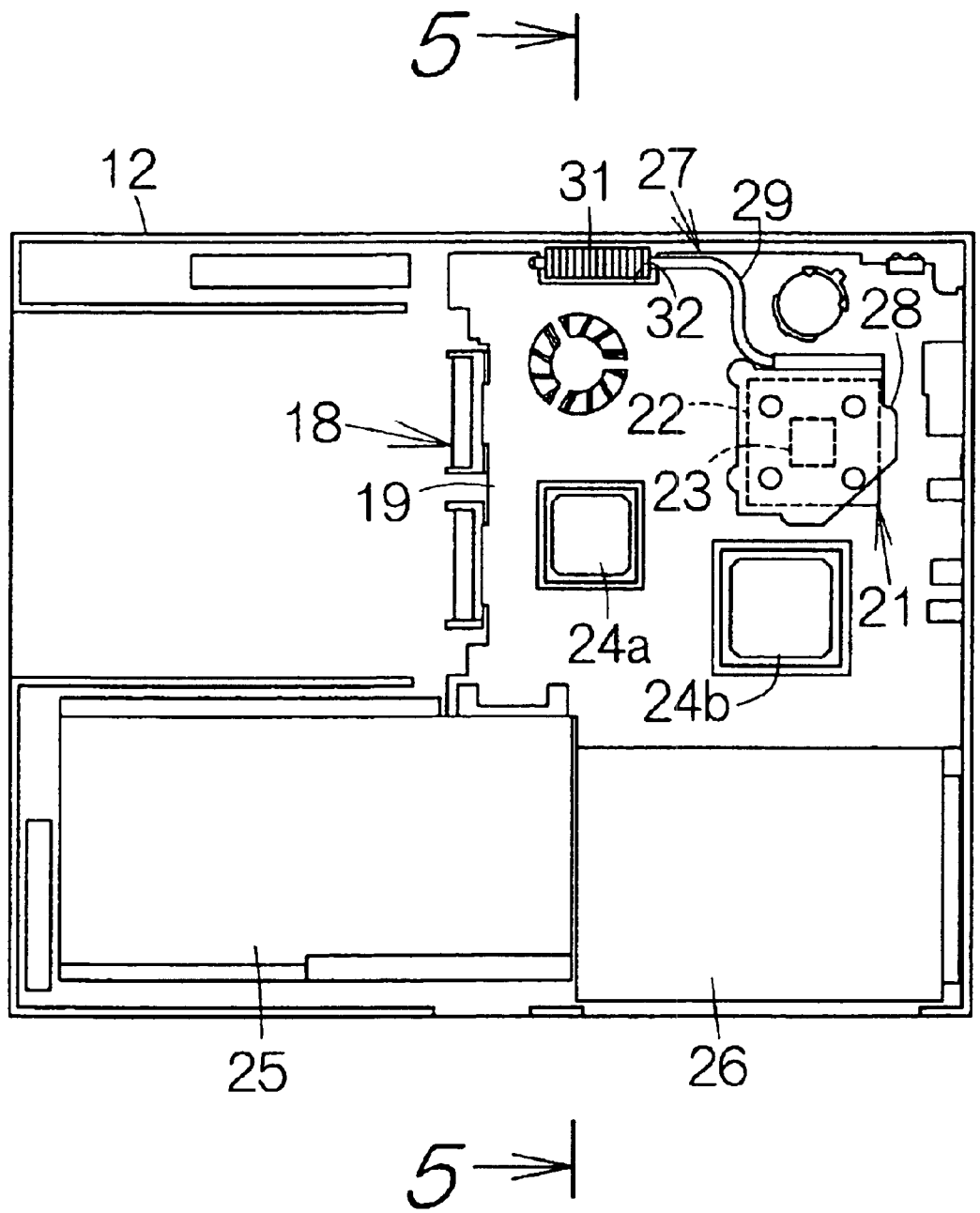
FIG. 2 is a plan view schematically illustrating the inner structure of a main body and the front surface of a printed circuit board unit.

As shown in FIG. 2, a printed circuit board unit 18 is incorporated within the main body 12. The printed circuit board unit 18 includes a printed circuit board 19 and a central processing unit (CPU) package 21 mounted on the front surface of the printed circuit board 19, for example. The CPU package 21 may include a small-sized ceramic substrate 22 and a CPU chip 23 mounted on the ceramic substrate 22, for example. Not only the CPU package 21 but also various electronic components 24a, 24b are mounted on the front surface of the printed circuit board 19. An electrically conductive wiring pattern, not shown, is formed to extend over the front surface of the printed circuit board, for example. The electrically conductive wiring pattern serves to establish electric connections between the CPU package 21 and the electronic components 24a, 24b as well as between the electronic components 24a, 24b.

Within the main body 12, a secondary battery 25 as well as a hard disk drive (HDD) 26 is connected to the printed circuit board unit 18, for example. The secondary battery 25 and the HDD 26 may be detachably incorporated within the main body 12. The secondary battery 25 supplies an electric power to the printed circuit board 18 in place of an AC power supply, for example. The HDD 26 is allowed to hold application software programs to be processed at the CPU chip 23 as well as various data utilized during the execution of the application software programs.

A cooling device 27 according to a first embodiment of the present invention is coupled to the CPU package 21. The cooling device 27 includes a heat receiving plate 28, of a higher heat conductive material, superposed on the upper surface of the CPU chip 23. One end of a heat conductive member such as a heat pipe 29 is connected to the heat receiving plate 28. The other end of the heat pipe 29 is connected to heat radiation fins 31 attached to the printed circuit board 19. Heat of the CPU chip 23 is transmitted to the heat radiation fins 31 via the heat receiving plate 28 and the heat pipe 29. The heat radiation fins 31 are allowed to protrude, out of a recess 32 defined in the printed circuit board 19, into a space at the back of the printed circuit board 19.

Figure 3:
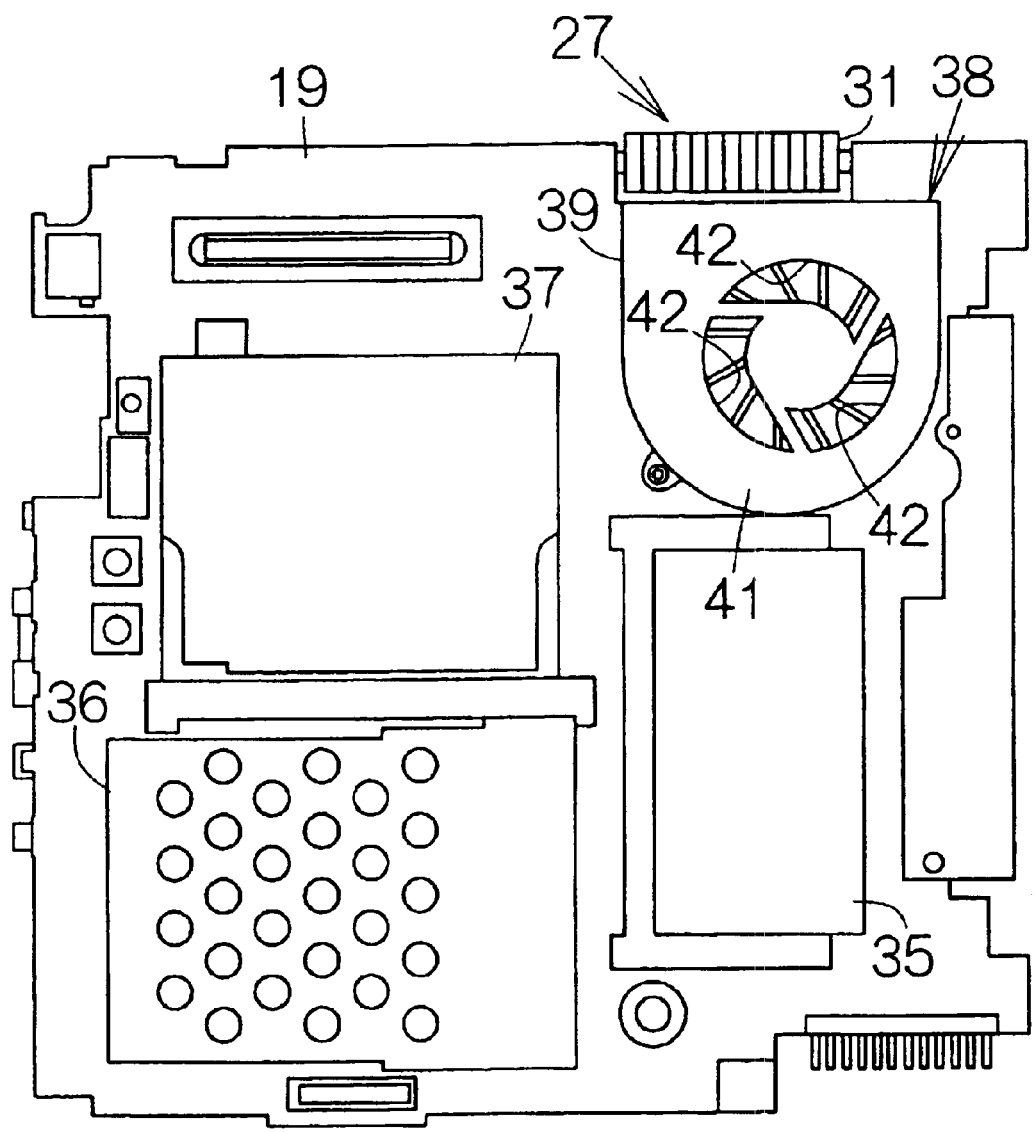
FIG. 3 is an enlarged plan view schematically illustrating the back surface of the printed circuit board unit.

As shown in FIG. 3, electronic components such as a memory module 35 including a random access memory (RAM), a PC card slot 36, a local area network (LAN) module 37 are mounted on the back surface of the printed circuit board 19. In this manner, relatively taller electronic components are mounted on the back surface of the printed circuit board 19 as compared with the front surface.

A fan unit 38 is further incorporated within the cooing device 27. The fan unit 38 is attached to the back surface of the printed circuit board 19, as shown in FIG. 3. The fan unit 38 includes a fan housing 39 fixed to the back surface of the printed circuit board 19. A top or ceiling wall 41 is defined in the fan housing 39. The ceiling wall 41 is allowed to extend along a datum plane parallel to the back surface of the printed circuit board 19. An inlet 42 is defined in the ceiling wall 41. The inlet 42 serves to interconnect the space inside the fan housing 39 and the space outside the fan housing 39 to each other.

Figure 4:
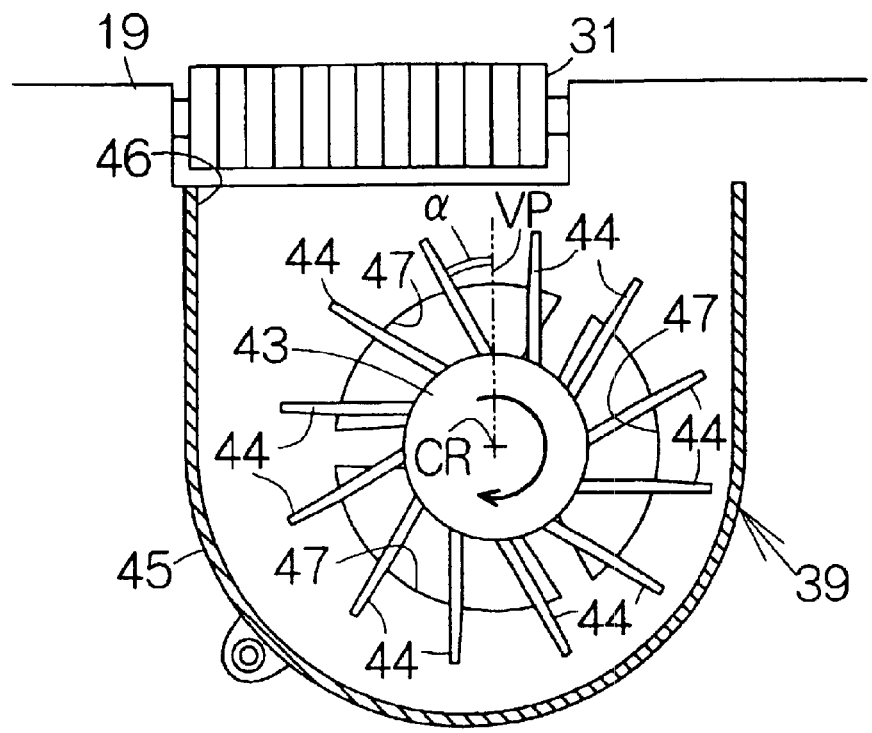
FIG. 4 is an enlarged plan view of a printed circuit board for schematically illustrating the main portion of a cooling device according to a first embodiment of the present invention.

Referring also to FIG. 4, a rotary member 43 is accommodated within the fan housing 39. The rotary member 43 is designed to rotate around the rotation axis CR extending in a direction perpendicular to the back surface of the printed circuit board 19. Blades 44 are integrally formed on the peripheral surface of the rotary member 43. The blades 44 may be located at equal intervals, for example. The respective blades 44 are designed to extend in the centrifugal directions from the rotary member 43. The individual blade 44 extends in a plane intersecting, by a predetermined inclination angle α, the vertical plane VP including the rotation axis CR. When the rotary member 43 rotates, the blades 44 serve to generate airflow in the centrifugal direction from the rotation axis CR. The rotary member 43 and the blades 44 constitute a so-called fan or ventilation fan.

As is apparent from FIG. 4, a housing wall 45 is defined in the fan housing 39. The housing wall 45 is designed to stand upright from the back surface of the printed circuit board 19 at the periphery of the blades 44, so that the housing wall 45 mostly surrounds the ventilation fan. Specifically, the inner surface of the housing wall 45 is opposed to the outer ends of the blades 44 at positions spaced from the outer ends of the blades 44. An outlet 46 is defined in the fan housing 39 at the break of the housing wall 45. The outlet 46 is located to face the heat radiation fins 31. An inlet 47 is also defined in the printed circuit board 19 inside the housing wall 45. The inlet 47 likewise serves to interconnect the space inside the fan housing 39 and the space outside the fan housing 39 to each other, in the same manner as the aforementioned inlet 42. Part of the printed circuit board 19 constitutes the fan housing 39.

Figure 5:
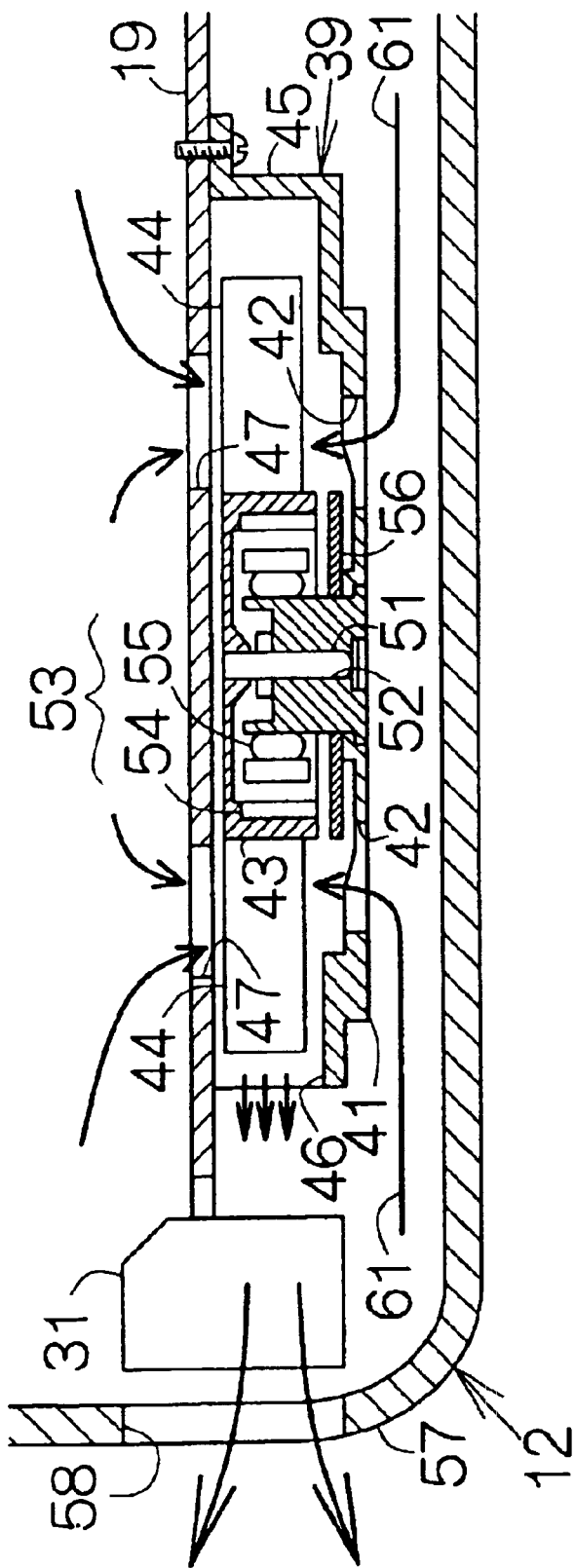
FIG. 5 is an enlarged partial sectional view taken along the line 5—5 in FIG. 2.

As is apparent from FIG. 5, the rotary member 43 is mounted on a rotary shaft 51 extending in the vertical direction perpendicular to the back surface of the printed circuit board 19. The rotary shaft 51 is received on a bearing 52 fixed to the ceiling wall 41 of the fan housing 39. A thin electric motor 53 is interposed between the rotary member 43 and the bearing 52. The electric motor 53 may include permanent magnets 54 attached to the rotary member 43, and stationary coils 55 fixed to the bearing 52 and opposed to the permanent magnets 54. A controller board 56 is also fixed to the ceiling wall 41 of the fan housing 39. A controller circuit is established on the controller board 56. The controller circuit operates to control the operation of the electric motor 53.

Now, when an electric power is supplied to the electric motor 53, the rotary member 43 rotates around the rotation axis CR. The blades 44 generate airflow in the centrifugal direction of the rotation axis CR. The generated airflow is guided along the housing wall 45 to the outlet 46. The air is discharged out of the outlet 46 in this manner.

An opening 58 is defined in an enclosure 57 of the main body 12. The opening 58 is located to face the outlet 46 of the fan unit 38. The air discharged out of the outlet 46 is allowed to flow through the heat radiation fins 31 and gets out of the main body 12 through the opening 58. The air absorbs the heat from the heat radiation fins 31. In this manner, the heat radiation from the heat radiation fins 31 is efficiently promoted.

A high speed airflow is generated based on the rotation of the blades 44 within the inner space surrounded by the printed circuit board 19, the housing wall 45 and the ceiling wall 41. The airflow efficiently absorbs the heat from the surface of the printed circuit board 19. The heat radiation from the printed circuit board 19 can be promoted. In general, an electrically conductive metallic wiring pattern extends over the surface of the printed circuit board 19. The metallic wiring pattern usually has a superior heat conductivity as compared with the material of the printed circuit board 19. The metallic wiring pattern thus contributes to promotion of the heat radiation from the printed circuit board 19. In particular, the metallic wiring pattern inside the housing wall 45 leads to an improved promotion of the heat radiation from the printed circuit board 19.

While the air is discharged out of the outlet 46 in the aforementioned manner, air is sucked into the fan housing 39 through the inlet 42. Since the inlet 42 in the ceiling wall 41 is opposed to the inner surface of the enclosure 57, airflow 61 can be generated along the inner surface of the enclosure 57 in response to the suction of the air into the inlet 42. In general, a number of electronic components are mounted on the back surface of the printed circuit board 19. The electronic components protrude from the back surface of the printed circuit board 19. The electronic components thus hinder a smooth flow of the air along the back surface of the printed circuit board 19. On the other hand, a generally flat surface is defined on the inner surface of the enclosure 57 of the main body 12. Less obstacles can be found on the inner surface of the enclosure 57. The smooth airflow 61 can be generated along the inner surface of the enclosure 57 of the main body 12. The air is smoothly sucked into the inlet 42. A large quantity of the air can be sucked into the fan housing 39, so that the cooling efficiency of the fan unit 38 can be improved. Since the air is smoothly introduced into the inlet 42 in this manner, a higher cooling efficiency can be kept even when the space is reduced between the ceiling wall 41 of the fan housing 39 and the inner surface of the enclosure 57.

At the same time, air can be sucked from the inlet 47 in the printed circuit board 19 in the fan unit 38. The air is introduced into the fan unit 38 not only from the space adjacent the back surface of the printed circuit board 19 but also from the space adjacent the front surface of the printed circuit board 19. A still larger quantity of the air can be sucked into the fan housing 39, so that the cooling efficiency of the fan unit 38 can further be improved. Moreover, the front surface of the printed circuit board 19 can be cooled down enough even when the fan unit 19 is located on the back surface of the printed circuit board 19.

Figure 6:
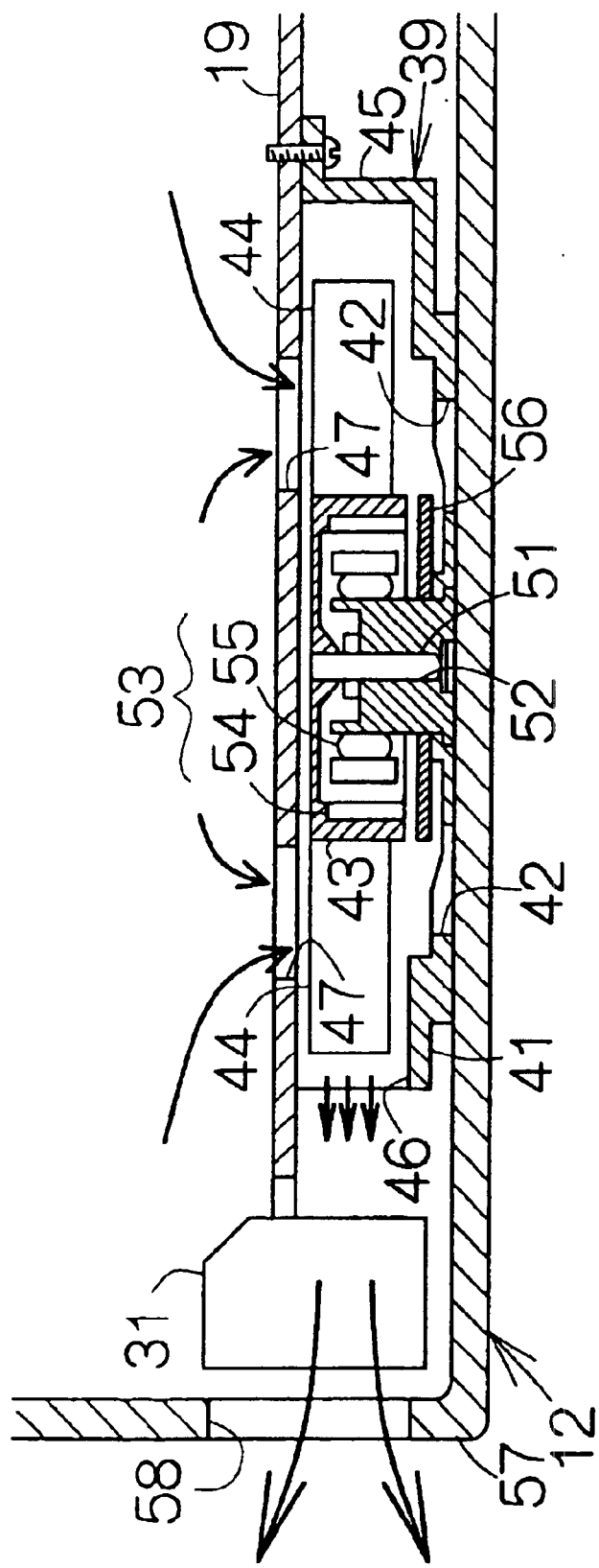
FIG. 6 is an enlarged partial sectional view, corresponding to FIG. 5, for schematically illustrating a modification of the cooling device.

When the inlet 47 is defined in the printed circuit board 19 in the aforementioned manner, the ceiling wall 41 of the fan housing 39 may completely superposed over the inner surface of the enclosure 57, as shown in FIG. 6. Air can be sucked enough into the fan housing 39 from the inlet 47 irrespective of the closure of the inlet 42. A sufficient cooling efficiency can be maintained in the fan unit 38. This structure is supposed to contribute to an additional reduction in the thickness of the main body 12.

Figure 7:
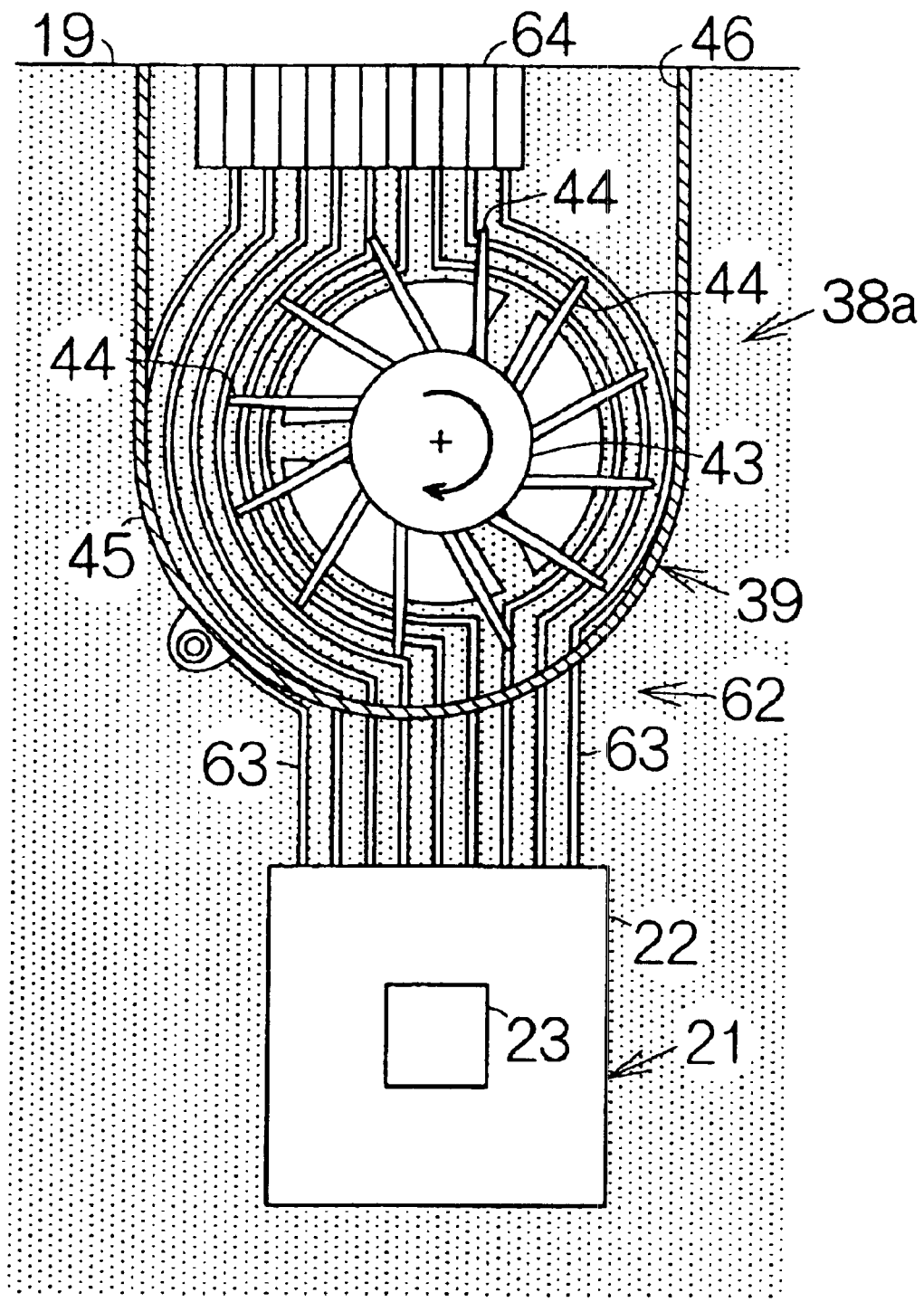
FIG. 7 is an enlarged plan view, corresponding to FIG. 4, for schematically illustrating the structure of a cooling device according to a second embodiment of the present invention.

FIG. 7 illustrates a cooling device 62 according to a second embodiment of the present invention. The cooling device 62 includes an electrically conductive wiring pattern 63 extending over the front surface of the printed circuit board 19, and heat radiation fins 64 attached to the front surface of the printed circuit board 19. The electrically conductive wiring pattern 63 is connected to a power consumption circuit, namely, the CPU package 21 and to the heat radiation fins 64. Soldering may be employed to fix the heat radiation fins 64 to the electrically conductive wiring pattern 63 on the printed circuit board 19. The electrically conductive wiring pattern 63 may function as a ground wire of the CPU package 21. It should be noted that like reference numerals are attached to the structure or components equivalent to those of the aforementioned first embodiment.

A fan unit 38a is attached to the front surface of the printed circuit board 19 in the cooling device 62. The fan unit 38a may have the structure identical to that of the fan unit 38 according to the first embodiment. The heat radiation fins 64 may be located within the outlet 46 of the fan unit 38a, for example. In addition, the electrically conductive wiring pattern 63 is allowed to extend from the CPU package 21 to the heat radiation fins 64 inside the housing wall 45.

The cooling device 62 induces the heat radiation of a higher efficiency from the printed circuit board 19 based on a high speed airflow generated within the fan housing 39 of the fan unit 38a in the same manner as described above. The electrically conductive wiring pattern 63 promotes the heat radiation from the printed circuit board 19. In addition, since the electrically conductive wiring pattern 63 is allowed to efficiently receive the heat from the CPU package 21, the CPU package 21 can efficiently be cooled down.

The air discharged from the outlet 46 is allowed to pass through the heat radiation fins 64. The air absorbs the heat from the heat radiation fins 64. The air thereafter gets out of the enclosure 57 of the main body 12 from the opening 58. The heat radiation from the heat radiation fins 64 can thus be promoted. Otherwise, any electrically wiring pattern for the ground of the electronic components 24a, 24b may likewise be connected to the heat radiation fins 64.

Figure 8:
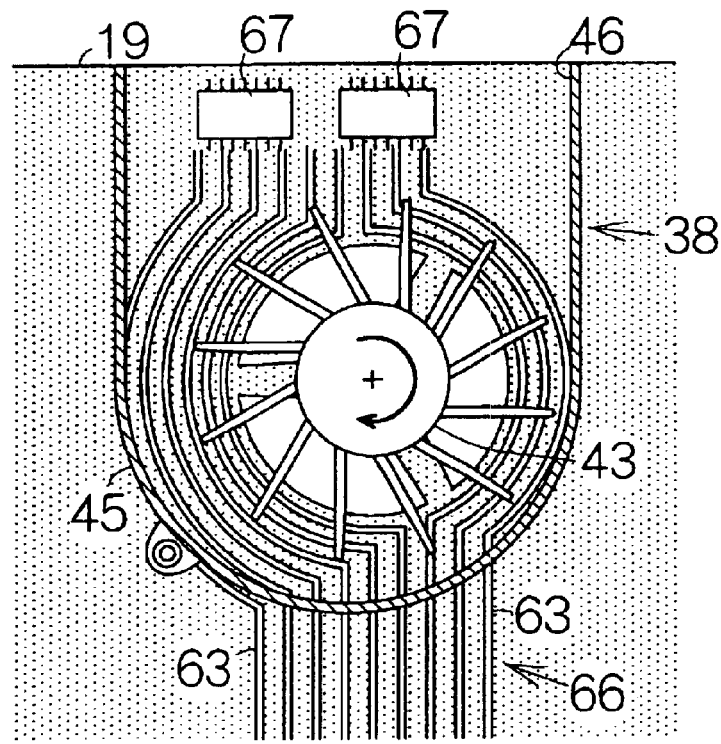
FIG. 8 is an enlarged plan view, corresponding to FIG. 4, for schematically illustrating the structure of a cooling device according to a third embodiment of the present invention.

FIG. 8 illustrates a cooling device according to a third embodiment of the present invention. The cooling device 66 likewise includes the aforementioned fan unit 38. Electronic components 67 are mounted on the back surface of the printed circuit board 19 inside the housing wall 45 in the fan unit 38. The electronic components 67 may be located at the outlet 46 of the fan unit 38, for example. The cooling device 66 of this type serves to promote the heat radiation from the electronic components 67 based on a high speed airflow generated within the fan housing 39 of the fan unit 38 in the same manner as described above. It should be noted that like reference numerals are attached to the structure or components equivalent to those of the aforementioned first embodiment.

The printed circuit board unit 18 along with the cooling device 27, 62, 66 may be incorporated not only in a portable electronic apparatus such as the aforementioned notebook personal computer 11 and a personal digital assistant (PDA) but also in a desktop type electronic apparatus. The bearing 52 for the rotary shaft 51 may be supported directly on the printed circuit board 19 in the fan unit 38, 38a.

What is claimed is:

1. A printed circuit board unit with a cooling device, comprising:
   a printed circuit board; a ventilation fan coupled to the printed circuit board for relative rotation to the printed circuit board, said ventilation fan having a rotation axis and a direction of said rotation axis Intersecting the printed circuit board;
   a housing wall standing from a surface of the printed circuit board at a periphery of the ventilation fan;
   an outlet defined in the housing wall;
   an electronic component mounted on the printed circuit board outside the housing wall; and
   an electrically conductive wiring pattern extending over the surface of the printed circuit board inside the housing wall and connected to the electronic component.

2. The printed circuit board unit with the cooling device according to claim 1, further comprising a radiation fin connected to the electrically conductive wiring pattern.

3. The printed circuit board unit with the cooling device according to claim 1, wherein the electronic component is a central processing unit.

4. An electronic apparatus comprising:
   a printed circuit board;
   a ventilation fan coupled to the printed circuit board for relative rotation to the printed circuit board, said ventilation fan having a rotation axis and a direction of said rotation axis intersecting the printed circuit board;
   a housing wall standing from a surface of the printed circuit board at a periphery of the ventilation fan;
   an outlet defined in the housing wall;
   an electronic component mounted on the printed circuit board outside the housing wall; and
   an electrically conductive wiring pattern extending over the surface of the printed circuit board inside the housing wall and connected to the electronic component.

5. The electronic apparatus according to claim 4, further comprising a radiation fin connected to the electrically conductive wiring pattern.

6. The electronic apparatus according to claim 4, wherein the electronic component is a central processing unit.

* * * * *